(12) United States Patent
Chou et al.

(10) Patent No.: US 11,217,621 B2
(45) Date of Patent: Jan. 4, 2022

(54) DEEP TRENCH ISOLATIONS AND METHODS OF FORMING THE SAME

(71) Applicant: Taiwan Semiconductor Manufacturing Company, Ltd., Hsinchu (TW)

(72) Inventors: Cheng-Hsien Chou, Tainan (TW); Chih-Yu Lai, Tainan (TW); Shih Pei Chou, Tainan (TW); Yen-Ting Chiang, Tainan (TW); Hsiao-Hui Tseng, Tainan (TW); Min-Ying Tsai, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 46 days.

(21) Appl. No.: 15/688,351

(22) Filed: Aug. 28, 2017

(65) Prior Publication Data

US 2017/0373117 A1    Dec. 28, 2017

Related U.S. Application Data

(62) Division of application No. 14/840,944, filed on Aug. 31, 2015, now Pat. No. 9,754,993.

(51) Int. Cl.
*H01L 27/146* (2006.01)
*H01L 29/06* (2006.01)
*H01L 21/762* (2006.01)

(52) U.S. Cl.
CPC .. *H01L 27/14687* (2013.01); *H01L 21/76229* (2013.01); *H01L 27/1463* (2013.01); *H01L 29/0653* (2013.01)

(58) Field of Classification Search
CPC .......... H01L 21/76229; H01L 27/1463; H01L 21/76232; H01L 21/76224–76291
See application file for complete search history.

(56) References Cited

U.S. PATENT DOCUMENTS

| | | | |
|---|---|---|---|
| 5,763,315 A | * | 6/1998 | Benedict .......... H01L 21/76232 438/424 |
| 5,945,724 A | | 8/1999 | Parekh et al. |
| 6,040,597 A | | 3/2000 | Kim et al. |
| 6,140,208 A | | 10/2000 | Agahi et al. |

(Continued)

FOREIGN PATENT DOCUMENTS

| CN | 103985711 A | 8/2014 |
|---|---|---|
| KR | 0127690 B1 | 4/1998 |

(Continued)

OTHER PUBLICATIONS

Fontaine, Ray "The State-of-the-Art of Mainstream CMOS Image Sensors," International Image Sensors Workshop (IISW) Recap, Jun. 2015, 4 pages.

*Primary Examiner* — Amar Movva
(74) *Attorney, Agent, or Firm* — Slater Matsil, LLP

(57) ABSTRACT

A method includes performing an anisotropic etching on a semiconductor substrate to form a trench. The trench has vertical sidewalls and a rounded bottom connected to the vertical sidewalls. A damage removal step is performed to remove a surface layer of the semiconductor substrate, with the surface layer exposed to the trench. The rounded bottom of the trench is etched to form a slant straight bottom surface. The trench is filled to form a trench isolation region in the trench.

20 Claims, 12 Drawing Sheets

(56) References Cited

U.S. PATENT DOCUMENTS

| | | | |
|---|---|---|---|
| 6,285,057 B1* | 9/2001 | Hopper | H01L 21/76264 |
| | | | 257/330 |
| 6,355,538 B1 | 3/2002 | Tseng | |
| 6,448,139 B2 | 9/2002 | Ito et al. | |
| 6,475,857 B1 | 11/2002 | Kim et al. | |
| 6,482,701 B1 | 11/2002 | Ishikawa et al. | |
| 6,667,223 B2 | 12/2003 | Seitz | |
| 7,297,995 B2 | 11/2007 | Mouli | |
| 2005/0003629 A1 | 1/2005 | Yonekawa et al. | |
| 2005/0153490 A1* | 7/2005 | Yoon | H01L 21/84 |
| | | | 438/164 |
| 2005/0253156 A1 | 11/2005 | Horio et al. | |
| 2006/0043437 A1 | 3/2006 | Mouli | |
| 2008/0264477 A1 | 10/2008 | Moslehi | |
| 2009/0289291 A1* | 11/2009 | Cheng | H01L 21/84 |
| | | | 257/301 |
| 2010/0144116 A1 | 6/2010 | Hopper et al. | |
| 2012/0187524 A1* | 7/2012 | Huang | H01L 21/31155 |
| | | | 257/506 |
| 2013/0095636 A1 | 4/2013 | Dutartre et al. | |
| 2013/0175611 A1* | 7/2013 | Shinohara | H01L 27/0924 |
| | | | 257/334 |
| 2014/0035083 A1* | 2/2014 | Wan | H01L 27/14685 |
| | | | 257/432 |
| 2014/0048129 A1 | 2/2014 | Chen et al. | |
| 2014/0225219 A1 | 8/2014 | Huang et al. | |

FOREIGN PATENT DOCUMENTS

| | | |
|---|---|---|
| KR | 127690 B1 | 4/1998 |
| KR | 20010037314 A | 5/2001 |
| KR | 100555490 B1 | 3/2006 |
| KR | 20140016795 A | 2/2014 |

* cited by examiner

DEEP TRENCH ISOLATIONS AND METHODS OF FORMING THE SAME

PRIORITY CLAIM AND CROSS-REFERENCE

This application is a divisional of U.S. patent application Ser. No. 14/840,944, entitled "Deep Trench Isolations and Methods of Forming the Same," filed on Aug. 31, 2015, which application is incorporated herein by reference.

BACKGROUND

Image sensor chips, which include Front-Side Illumination (FSI) image sensor chips and Backside Illumination (BSI) image sensor chips, are widely used in applications such as cameras. In the formation of image sensor chips, image sensors (such as photo diodes) and logic circuits are formed on a silicon substrate of a wafer, followed by the formation of an interconnect structure on a front side of the wafer. In the FSI image sensor chips, color filters and micro-lenses are formed over the interconnector structure. In the formation of the BSI image sensor chips, after the formation of the interconnect structure, the wafer is thinned, and backside structures such as color filters and micro-lenses are formed on the backside of the respective wafer. When the image sensor chips are used, light is projected on the image sensors, in which the light is converted into electrical signals.

In the image sensor chips, deep trenches are formed in the silicon substrate to separate the image sensors from each other. The deep trenches are filled with dielectric materials, which may include an oxide, to isolate the neighboring devices from each other.

The image sensors in the image sensor chips generate electrical signals in response to the stimulation of photons. The light received by one micro-lens and the underlying color filter, however, may be tilted. The tilted light may penetrate through the deep trench that is used to separate the image sensors. As a result, cross-talk occurs due to the interference of the light that is undesirably received from neighboring pixels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
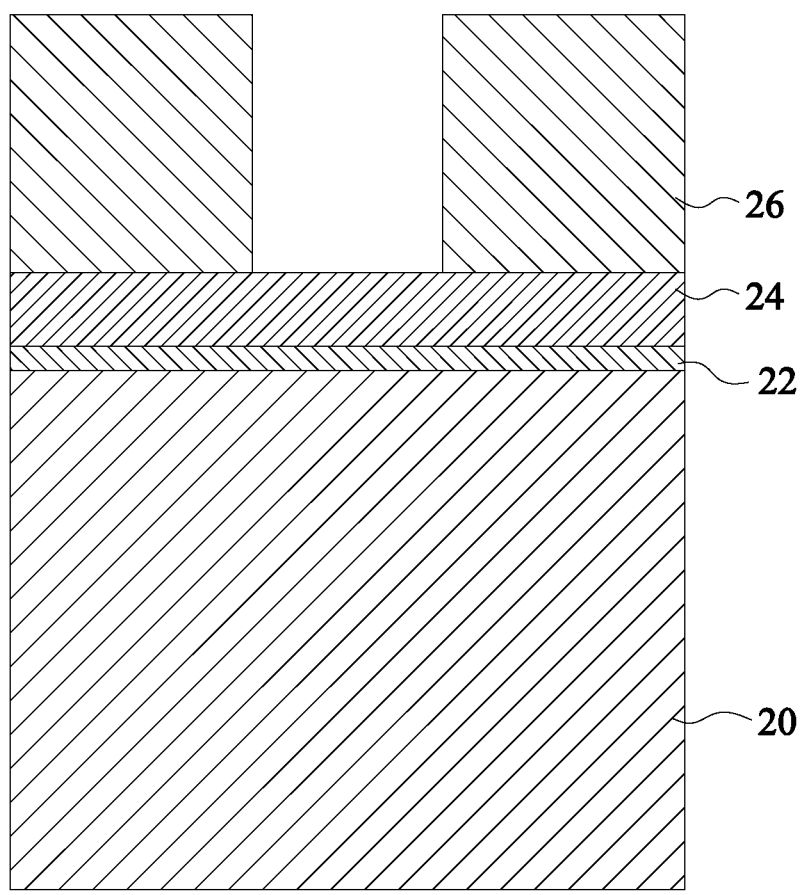
FIGS. 1 through 9B illustrate the cross-sectional views of intermediate stages in the formation of deep trench isolation regions in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Deep Trench Isolation (DTI) regions and the methods of forming the same are provided in accordance with various exemplary embodiments. The intermediate stages of forming the DTI regions are illustrated. Some variations of embodiments are discussed. Throughout various views and illustrative embodiments, like reference numbers are used to designate like elements.

Figure 16:
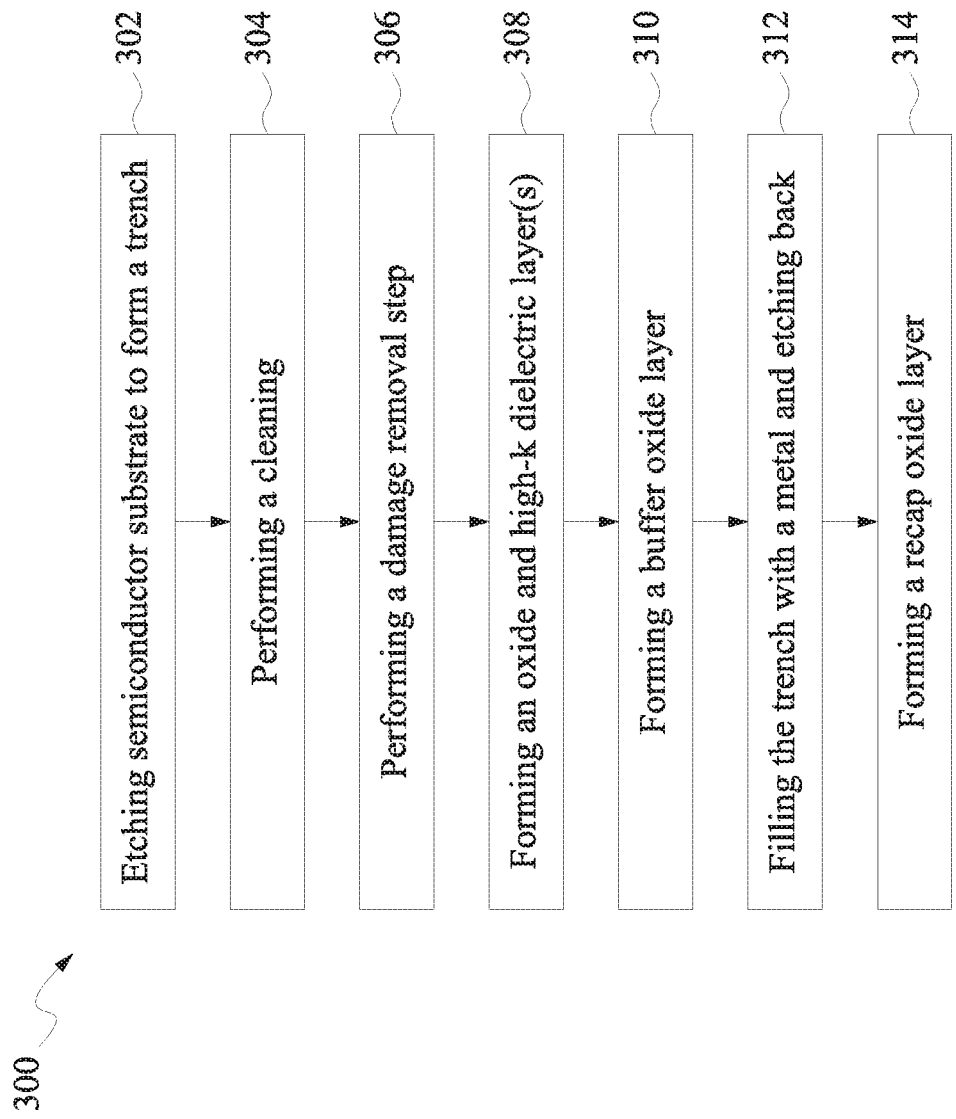
FIG. 16 illustrates a process flow for forming deep trench isolation regions in accordance with some embodiments.

FIGS. 1 through 9B illustrate the cross-sectional views of intermediate stages in the formation of DTI regions in accordance with some embodiments. The DTI regions may be used in image sensor chips (such as Front-Side Illumination (FSI) image sensor chips or Backside Illumination (BSI) image sensor chips) in accordance with some embodiments. The steps shown in FIGS. 1 through 9B are also illustrated schematically in the process flow 300 shown in FIG. 16. In the subsequent discussion, the process steps shown in FIGS. 1 through 9B are discussed referring to the process steps in FIG. 16.

Figure 3:
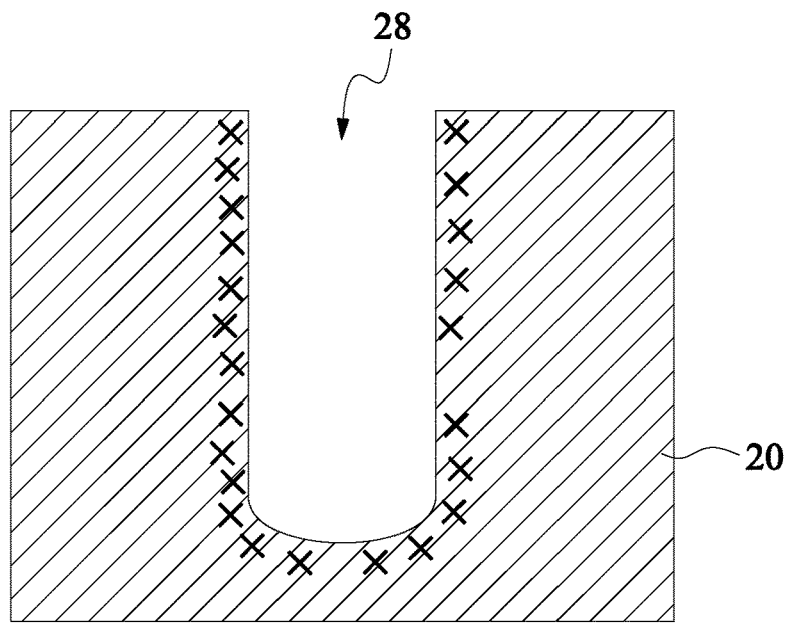

Referring to FIG. 3, semiconductor substrate 20 is provided. Semiconductor substrate 20 may comprise, for example, bulk silicon, doped or undoped, or an active layer of a Semiconductor-On-Insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, substrate 20 may include another elementary semiconductor, such as germanium; a compound semiconductor including silicon carbon, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In accordance with some embodiments, pad layer 22 and mask layer 24 are formed on semiconductor substrate 20. Pad layer 22 may be a thin film comprising silicon oxide formed, for example, using a thermal oxidation process or Chemical Vapor Deposition (CVD). The thickness of pad oxide layer 22 may be between about 10 Å and about 100 Å. It is appreciated, however, that the values recited throughout the description are merely examples, and may be changed to different values. Pad layer 22 may also act as an etch stop layer for etching mask layer 24. In accordance with some embodiments, mask layer 24 is formed of silicon nitride, for example, using Low-Pressure Chemical Vapor Deposition (LPCVD). In accordance with other embodiments, mask layer 24 is formed using thermal nitridation of silicon, Plasma Enhanced Chemical Vapor Deposition (PECVD), or the like. The thickness of mask layer 24 may be between about 100 Å and about 1,000 Å. Mask layer 24 may be used as a hard mask during subsequent photolithography processes. Mask layer 24 may also act as a bottom anti-reflective coating. Photo resist 26 is formed on mask layer 24 and is then patterned.

Figure 2:
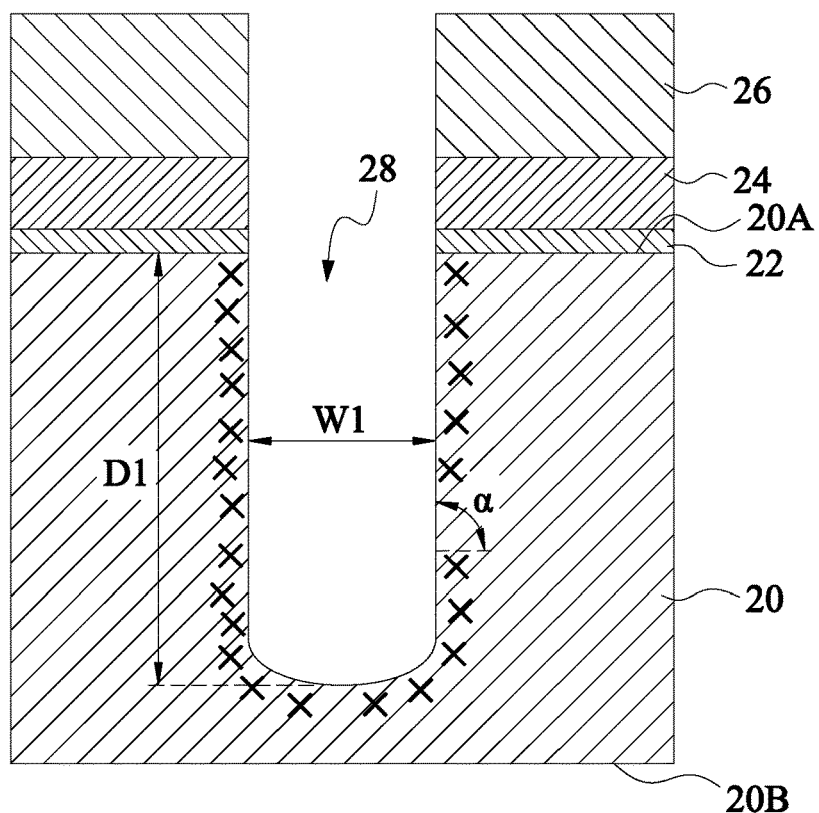
Figure 13:
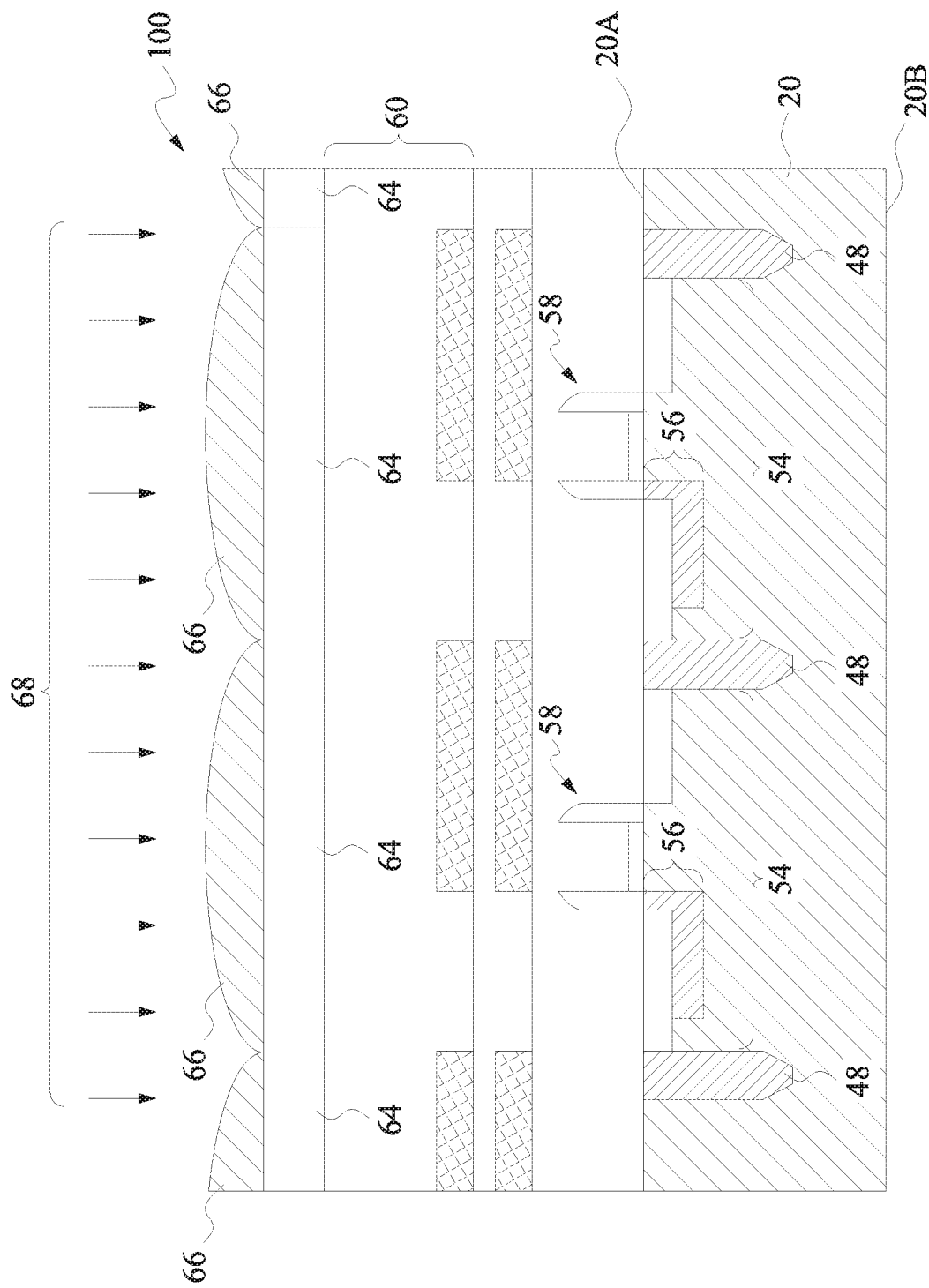
FIGS. 13 and 14 illustrate portions of a Front-Side Illumination (FSI) image sensor chip and a portion of a Backside Illumination (BSI) image sensor chip, respectively, in accordance with some embodiments.
Figure 14:
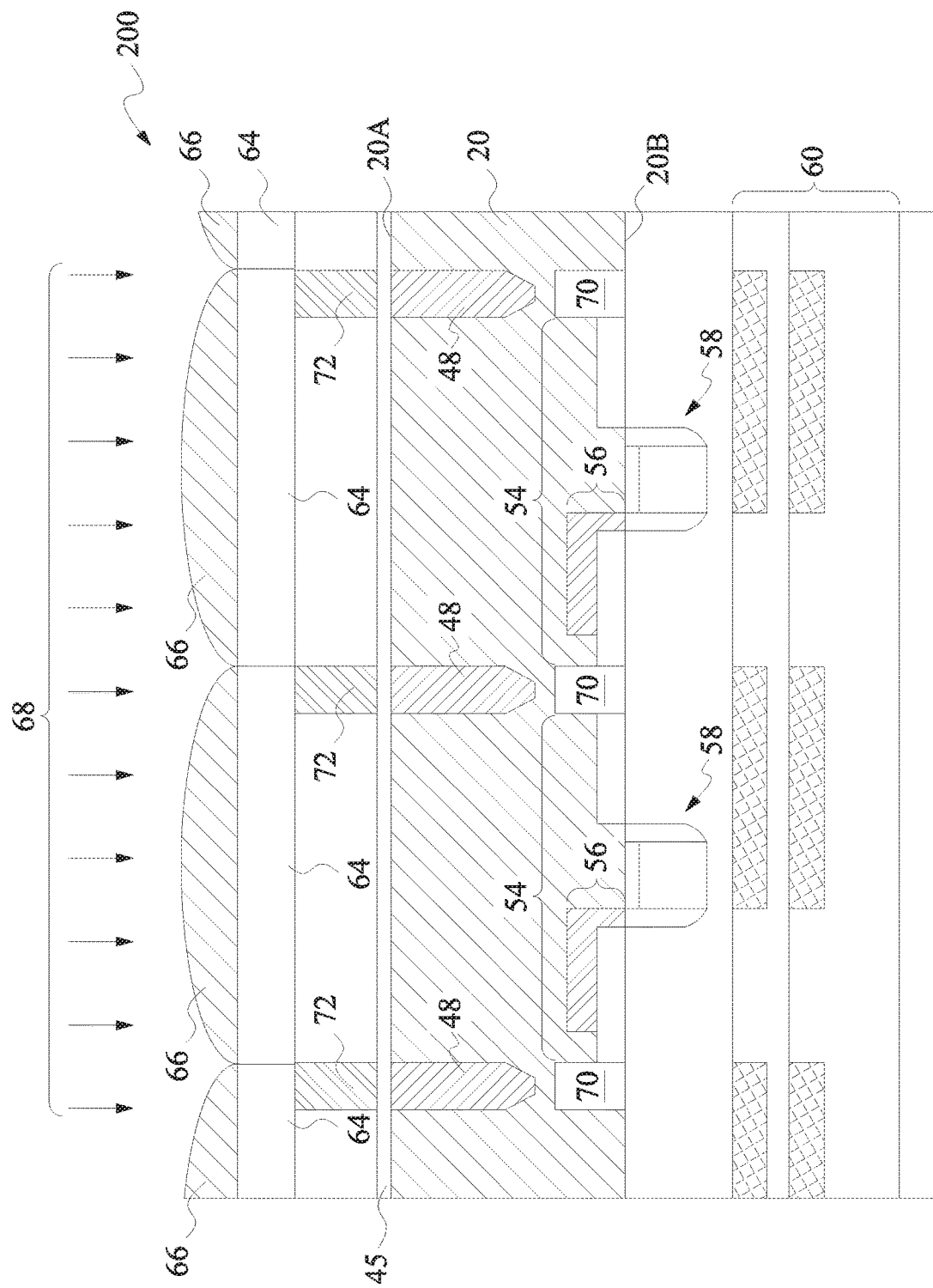

Next, referring to FIG. 2, photo resist 26 is used as an etching mask to etch the underlying layers. Accordingly, trench 28 is formed in hard mask layer 24, pad layer 22, and extends into semiconductor substrate 20. The respective step is shown as step 302 in the process flow shown in FIG. 16. Trench 28 extends from major surface 20A into semiconductor substrate 20. The bottom of trench 28 is at an intermediate level between major surface 20A and major surface 20B of semiconductor substrate 20. In accordance with some embodiments, major surface 20A is the front surface, at which active devices such as transistors are formed, as shown in FIG. 13. In accordance with alternative embodiments, major surface 20A is the back surface opposite to the front surface, as shown in FIG. 14.

The etching is performed through an anisotropic etching, so that the sidewalls of trench 28 are straight and vertical, wherein the sidewalls are perpendicular to major surfaces 20A and 20B. Furthermore, there may be process variations, causing trench 28 to be slightly tapered, and hence the sidewalls of trench 28 are substantially perpendicular to (with a slight tilting) major surfaces 20A and 20B, for example, with the tilt angle α being greater than about 88 degrees, and between about 88 degrees and about 90 degrees. In accordance with some exemplary embodiments, the etching is performed through a dry etching method including, and not limited to, Inductively Coupled Plasma (ICP), Transformer Coupled Plasma (TCP), Electron Cyclotron Resonance (ECR), Reactive Ion Etch (RIE), and the like. The process gases include, for example, fluorine-containing gases (such as $SF_6$, $CF_4$, $CHF_3$, $NF_3$), Chlorine-containing gases (such as $Cl_2$), $Br_2$, HBr, $BCl_3$ and/or the like. After the formation of trench 28, photo resist 26 (if any left), hard mask layer 24, and pad layer 22 are removed.

In accordance with some exemplary embodiments, aspect ratio D1/W1 of trench 28 is greater than about 2, or greater than about 3 or higher, wherein D1 is the depth of trench 28, and W1 is the width of trench 28. The bottom surface of trench 28 is rounded and has a U-shape in the cross-sectional view. The rounded portion may be curved smoothly all the way from a vertical sidewall of trench to the vertical sidewall on the opposite side of trench 28.

Next, a cleaning step is performed. The respective step is shown as step 304 in the process flow shown in FIG. 16. The cleaning may be a wet clean using ST250 (a trademark of ATMI Incorporated) solvent, for example. The cleaning may, or may not, cause a thin surface layer of semiconductor substrate 20 that is exposed to trench 28 to be removed. The bottom surface of trench 28 may remain to be rounded and curved after the cleaning step, as shown in FIG. 3.

Due to the bombardment effect in the formation of trench 28, the surface layer of semiconductor substrate 20 is damaged, wherein the damaged surface layer is exposed to trench 28, and at least some portions of the damaged surface layer are left after the cleaning step. The damage may further be caused by the penetration of the atoms (such as carbon atoms) in the process gases (used in forming trench 28) into the surface layer. The damage may include atom displacement, vacancy, and/or the like, which are symbolized by the "x" signs. The damaged surface layer causes the increase in the dark currents of image sensor pixels when the resulting DTI region is used for isolating the image sensor pixels. The damaged surface layer may also cause the increase in white pixels, which are the pixels generating currents when not exposed to light. Accordingly, the surface layer is reduced in a damage removal step, as shown in FIG. 4.

Figure 4:
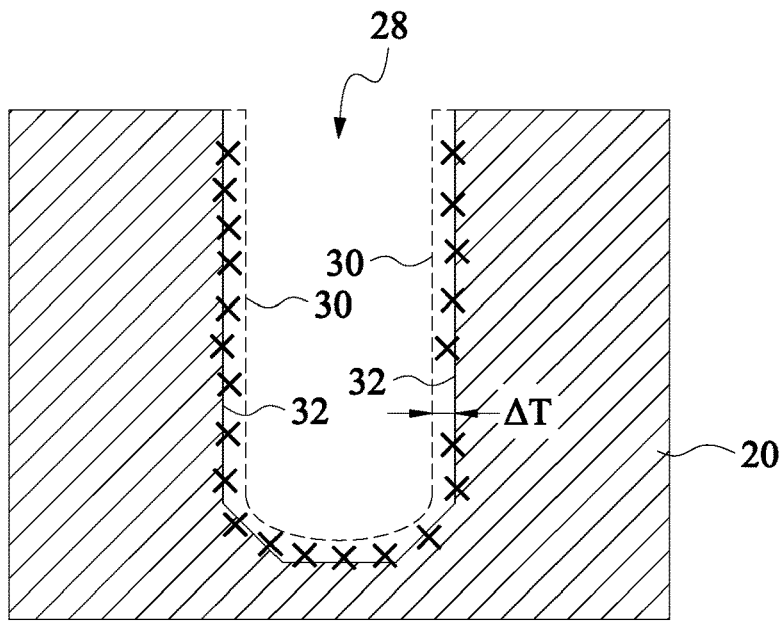

Referring to FIG. 4, a damage removal step is performed to remove the damaged surface layer. The respective step is shown as step 306 in the process flow shown in FIG. 16. In FIG. 4, dashed line 30 represents the position of the surfaces of semiconductor substrate 20 before the damage removal step. The damages as symbolized by signs "x" are mostly in the removed surface layer. Accordingly, after the damage removal step, at least most of, and possible substantially all, of the displacements, vacancies, and the like are also removed, and the surfaces 32 represent the surfaces after the removal.

The damage removal step may comprise a wet etch, which may be performed using an alkaline-containing (base-containing) solution. In accordance with some embodiments, Tetra-Methyl Ammonium Hydroxide (TMAH) is used in the damage removal step. In accordance with alternative embodiments, the solution of $NH_4OH$, potassium hydroxide (KOH) solution, sodium hydroxide (NaOH), or the like is used to remove the damaged surface layer. The thickness ΔT of the removed surface layer may be greater than about 50 nm, and may be in the range between about 50 nm and about 135 nm. Experiment results indicated that the damage removal step in accordance with some embodiments can effectively remove the damages.

In accordance with some embodiments in which TMAH is used, the damage removal step is performed for a period of time longer than about 15 seconds, longer than about 30 seconds, or longer than about 45 seconds. In accordance with some experiment results, about 30-seconds etching using TMAH results in a 90 nm surface layer removal.

Figure 5A:
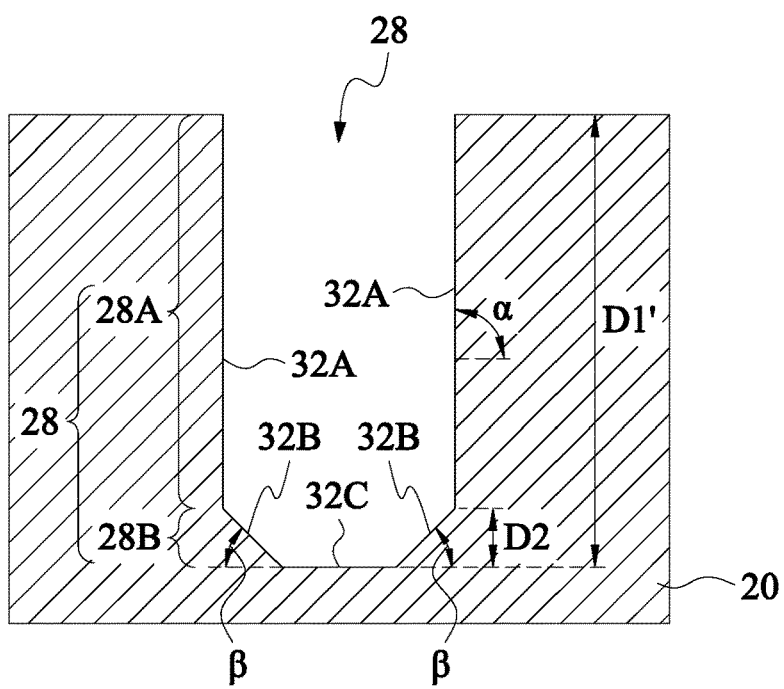

FIG. 5A illustrates the resulting trench 28 after the damage removal step. As shown in FIG. 5A, trench 28 includes upper portion 28A and lower portion 28B connected to upper portion 28A. Sidewalls 32A has substantially vertical sidewalls 32A, which is vertical or substantially vertical with tilt angles greater than about 88 degrees or greater than about 89 degrees in accordance with some embodiments. Upper portion 28A of trench 28 is accordingly referred to as vertical upper portion throughout the description.

In the damage removal step, with the removal of the surface layer, the sidewalls of trench 28 recess from the position shown as 30 in FIG. 4 to the position shown as 32. In the meantime, the rounded bottom surface also recesses. Since the etching rates of semiconductor substrate 20 on different surface planes are different from each other, slant straight surfaces 32B are formed on (111) surface planes, which have tilt angle β equal to about 54.7 degrees. Also, planar bottom surface 32C is also formed, which may be on (001) surface plane (also (100) surface plane). Surfaces 32B and 32C in combination form the bottom surface of the lower portion 28B of trench 28. Lower portion 28B has a U-shape in the cross-sectional view in these embodiments, and hence is referred to as a U-shaped lower portion in accordance with some embodiments.

In accordance with some embodiments, depth Dr of trench 28 is in the range between about 0.5 μm and about 2.5 μm, in which depth D2 of the lower portion 28 may be in the range between about 5 percent and about 15 percent of depth D1'.

In accordance with some embodiments, the damage removal step is stopped before surfaces 32B on the opposite sides of trench 28 merge with each other, as shown in FIG. 5A. In accordance with other embodiments, the damage removal step is continued until surfaces 32B on the opposite sides of trench 28 merge with each other, and hence resulting in the profile shown in FIG. 5B. Lower portion 28B has a V-shape in the cross-sectional view in accordance with some embodiments, and hence is referred to as a V-shaped lower portion. Similarly, surfaces 32B are formed on (111) surface planes, and have 54.7 degree tilt angles.

Figure 5B:
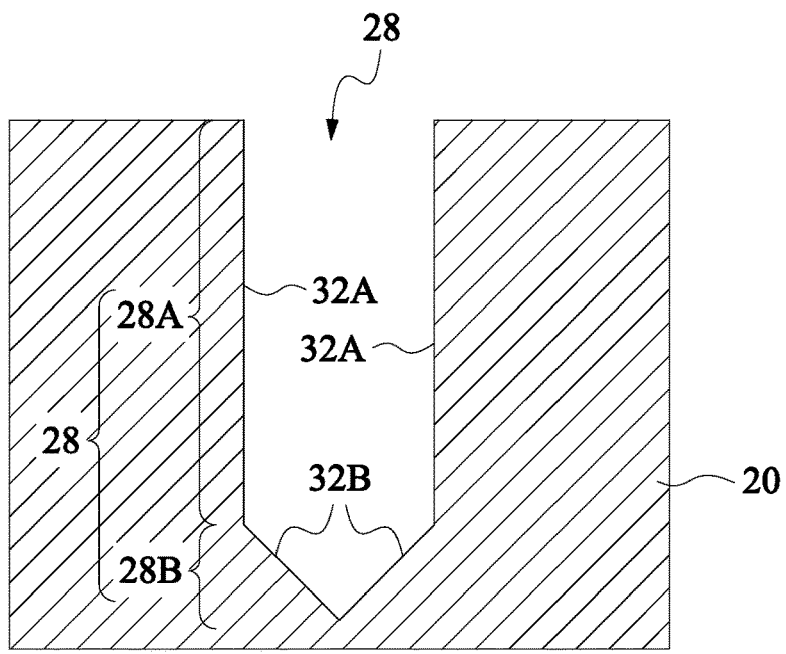

In accordance with some embodiments, during the period of time starting from the time trench 28 is formed to the time the step shown in FIG. 5B or FIG. 5C is finished, no annealing is performed. Experiment results have indicated that annealing during this period of time is not effective for reducing dark currents and white pixels.

Figure 6:
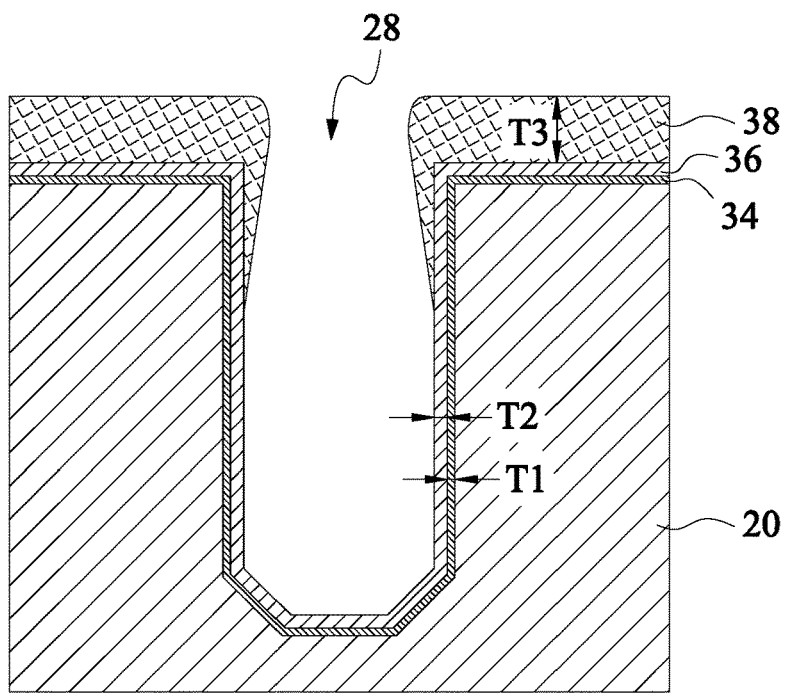
Figure 7:
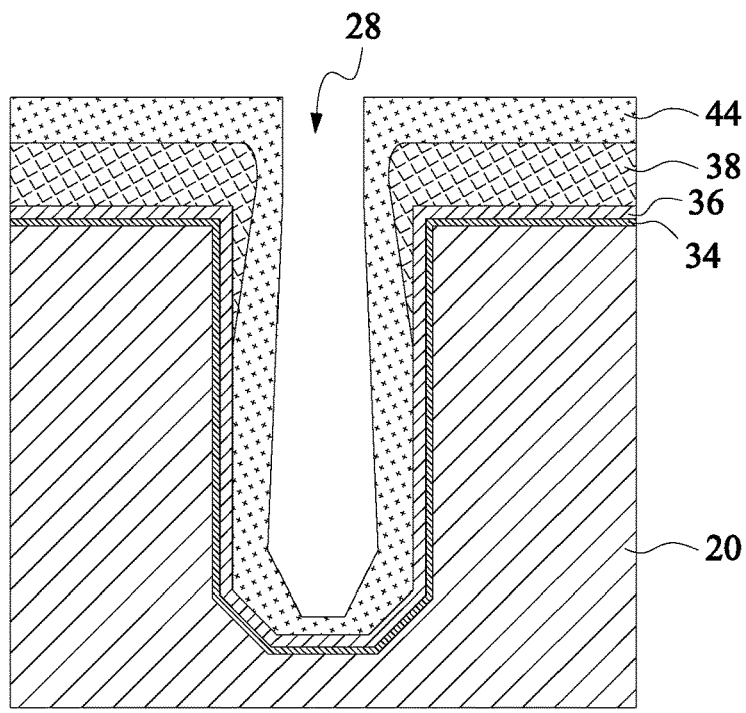

FIGS. 6 and 7 illustrate the formation of a plurality of dielectric layers. The respective step is shown as step 308 in the process flow shown in FIG. 16. Referring to FIG. 6, oxide layer 34 and one or more high-k dielectric layer such as first high-k dielectric layer 36 and second high-k dielectric layer 38 are formed. In accordance with some embodiments of the present disclosure, oxide layer 34 is formed through thermal oxidation. Oxide layer 34 may comprise silicon oxide when semiconductor substrate 20 includes silicon. In accordance with alternative embodiments, oxide layer 34 is deposited using Chemical Vapor Deposition (CVD). Thickness T1 of oxide layer 34 may be in the range between about 20 Å and about 80 Å. First high-k dielectric layer 36 may comprise $HfO_2$ in accordance with some embodiments, and may be formed using a conformal deposition method such as Atomic Layer Deposition (ALD). Thickness T2 of high-k dielectric layer 36 may be in the range between about 40 Å and about 100 Å. The second high-k dielectric layer 38 may comprise $Ta_2O_5$, and may be formed using a non-conformal deposition method such as Physical Vapor Deposition (PVD). Thickness T3 of high-k dielectric layer 38 may be in the range between about 300 Å and about 800 Å. Since high-k dielectric layer 38 may be non-conformal, thickness T3 is measured at the horizontal portion of high-k dielectric layer 38 over semiconductor substrate 20. From the top to the bottom of trench 28, the thicknesses of high-k dielectric layer 38 may reduce, as shown in FIG. 6.

Next, as shown in FIG. 7, dielectric layer 44 is formed. In accordance with some embodiments of the present disclosure, dielectric layer 44 comprises an oxide such as silicon oxide, which may be formed using CVD or Plasma Enhanced CVD (PECVD) in accordance with some embodiments. Dielectric layer 44 is also referred to as buffer oxide layer 44. The respective step is shown as step 310 in the process flow shown in FIG. 16.

Figure 8:
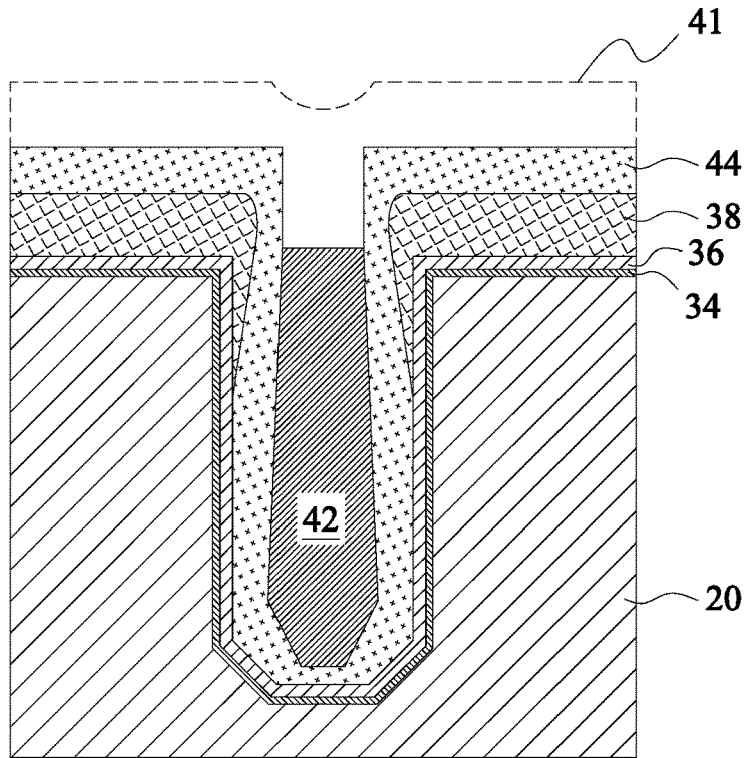

FIG. 8 illustrates the filling and the etch-back for forming metal core 42. The respective step is shown as step 312 in the process flow shown in FIG. 16. The formation of metal core 42 includes a deposition step to form a metal layer, which is performed using PVD, Metal-Organic Chemical Vapor Deposition (MOCVD), or the like. Dashed lines 41 schematically illustrate the metal layer. The metal layer includes a portion fully filling the remaining portion of trench 28, and additional portions (not shown) over the horizontal portions of buffer oxide layer 44. Next, an etch-back is performed, and the horizontal portions of the metal layer outside of trench 28 (FIG. 7) are removed. The remaining portion is shown in FIG. 8, and is referred to as metal core 42. The top surface of metal core 42 may be at any of various positions such as lower than, level with, or higher than, the top surface of semiconductor substrate.

Figure 9A:
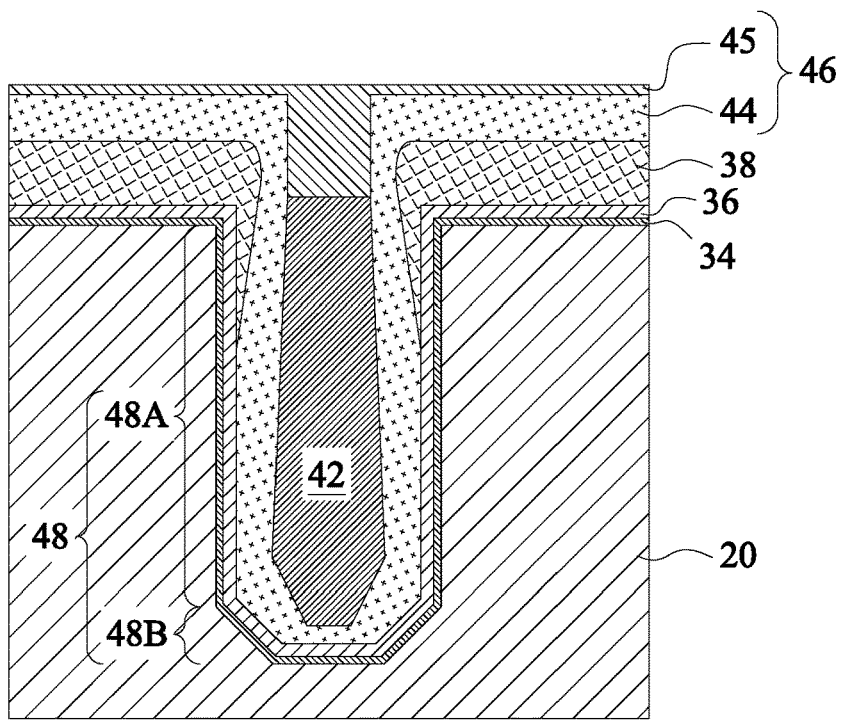
FIG. 9C illustrates a top view of deep trench isolation regions in accordance with some embodiments.

FIG. 9A illustrates the formation of recap dielectric layer 45. The respective step is shown as step 314 in the process flow shown in FIG. 16. The formation process includes a filling step to fill the recess shown in FIG. 8, wherein a portion of recap dielectric layer 45 is formed over dielectric layer 44. A planarization step is then performed to planarize the top surface of recap dielectric layer 45. In accordance with some embodiments, recap dielectric layer 45 comprises silicon oxide, and hence is referred to as recap oxide layer 45 in accordance with some embodiments. Recap oxide layer 45 and dielectric layer 44 in combination are referred to as dielectric 46. Throughout the description, the portions of the layers in trench 28 are in combination referred to as DTI region 48. DTI region 48 in accordance with some embodiments includes vertical upper portion 48A, and U-shaped lower portion 48B.

Figure 9B:
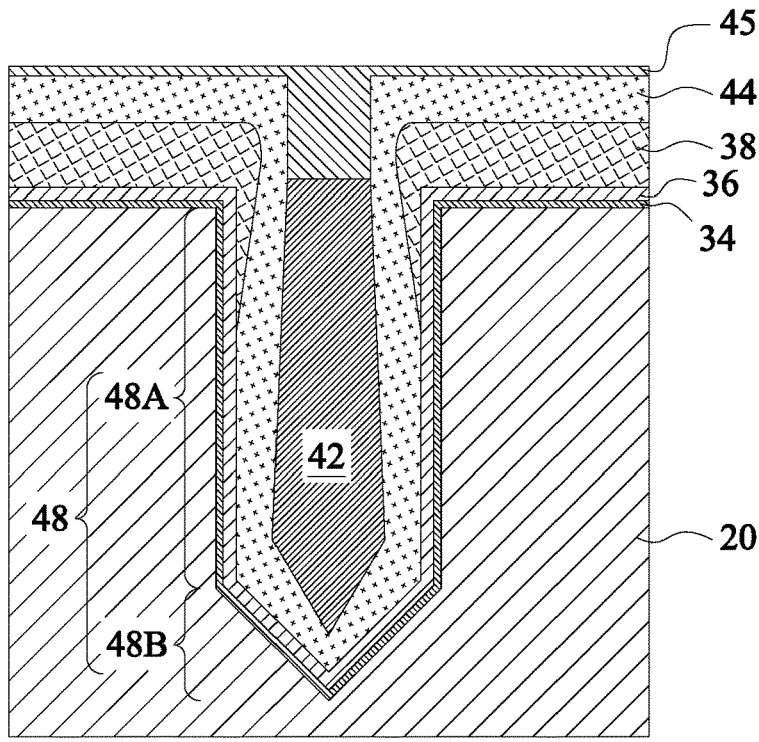

FIG. 9B illustrates the formation of DTI structure 48 in accordance with some embodiments, wherein trench 28 has the V-shaped lower portion. Accordingly, the resulting DTI region 48 in accordance with some embodiments includes vertical upper portion 48A, and V-shaped lower portion 48B.

Figure 9C:
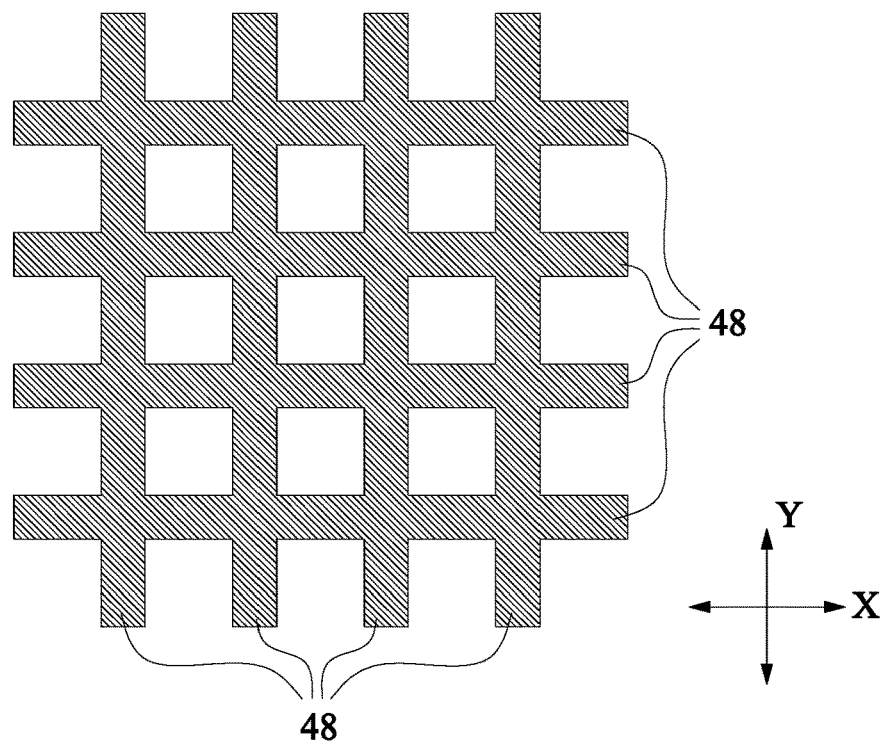

FIG. 9C illustrates a top view of DTI regions 48. In accordance with some embodiments, a plurality of DTI regions 48 are formed simultaneously, each having the structure shown in FIG. 9A or 9B. The plurality of DTI regions 48 form a plurality of strips, including a first plurality of strips 48 extending in the X-direction, and a second plurality of strips 48 extending in the Y-direction, which is perpendicular to the X-direction. Hence, the first plurality of strips 48 and the second plurality of strips 48 form a grid pattern, with a plurality of portions of semiconductor substrate 20 separated from each other, and defined by, the grid.

Figure 10:
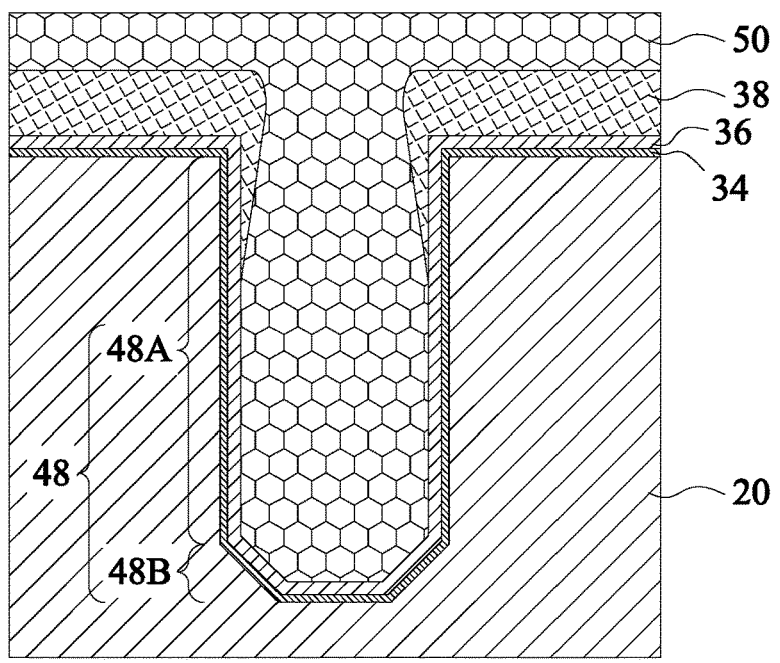
FIGS. 10 through 12 illustrate the cross-sectional views of deep trench isolation regions in accordance with some embodiments.
Figure 11:
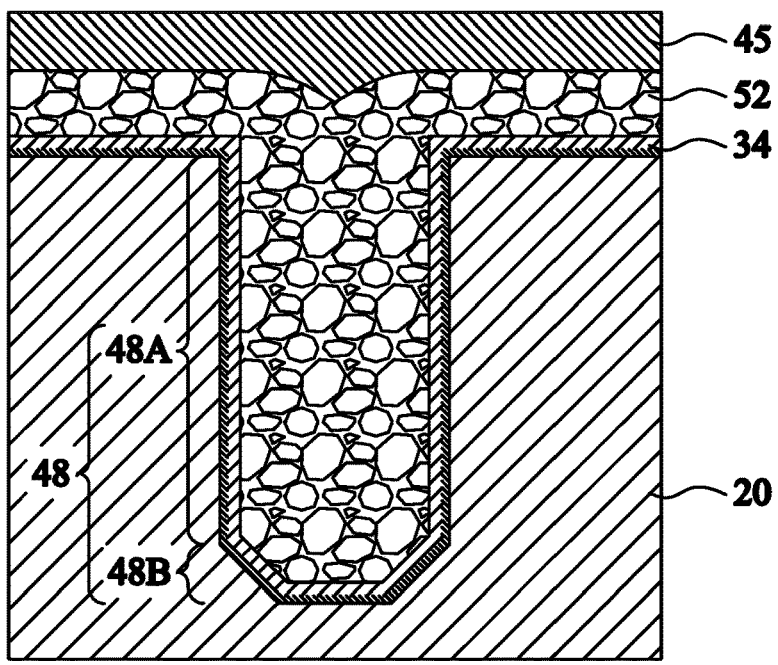
Figure 12:
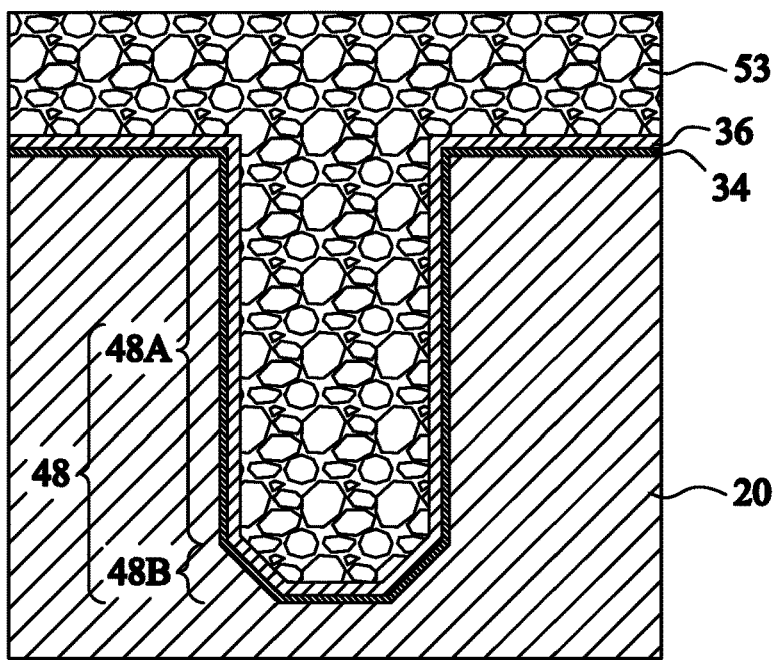

FIGS. 10 through 12 illustrate the cross-sectional views of deep trench isolation regions 48 in accordance with some embodiments of the present disclosure. Unless specified otherwise, the materials and the formation methods of the components in these embodiments are essentially the same as the like components, which are denoted by like reference numerals in the embodiments shown in FIGS. 1 through 9C. The details regarding the formation process and the materials of the components shown in FIGS. 10 through 12 may thus be found in the discussion of the embodiments shown in FIGS. 1 through 9C.

The initial steps of some embodiments are essentially the same as shown in FIGS. 1 through 6, and hence are not repeated herein. Next, referring to FIG. 10, in accordance with some embodiments, after the formation of layers 34, 36, and 38, oxide layer 50 is formed. Oxide layer 50 may be formed of silicon oxide. Oxide layer 50 fills the remaining trench 28 as shown in FIG. 6, and includes some portions over high-k dielectric layer 38. Next, a planarization step is performed to planarize the top surface of oxide layer 50. In the resulting structure, oxide layer 50 includes a remaining portion covering high-k dielectric layer 38. Accordingly, oxide layer 50 fills trench 28 (FIG. 6) and also functions as a recap oxide layer. The resulting DTI region 48 thus includes an oxide region filling the space defined by high-k dielectric layer 38.

Referring to FIG. 11, in accordance with some embodiments, after the formation of dielectric layer 34, high-k dielectric layer 52 is formed to fully fill the remaining trench 28. High-k dielectric layer 52 may be formed of $HfO_2$ in accordance with some embodiments. In accordance with some embodiments, high-k dielectric layer 52 includes some portions over the top surface of semiconductor substrate 20. Next, recap oxide layer 45 is formed over high-k dielectric layer 52, and a planarization step is performed to planarize the top surface of recap oxide layer 45.

Referring to FIG. 12, in accordance with some embodiments, after the formation of layers 34 and 36, polysilicon layer 53 is formed. Polysilicon layer 53 fills the remaining trench 28 as shown in FIG. 6. Polysilicon layer 53 includes some portions over high-k dielectric layer 36. Next, a planarization step is performed to planarize the top surface of polysilicon layer 53. The resulting DTI region 48 thus includes a polysilicon region filling the space defined by high-k dielectric layer 36. In accordance with some embodiments, no recap oxide layer is formed over polysilicon layer 53.

FIGS. 13 and 14 illustrate the embodiments in which DTI regions 48 are used in FSI image sensor chips/wafers and BSI image sensor chips/wafers, respectively. In FIGS. 13 and 14, the detailed structures of DTI regions 48 are not illustrated, and the detailed structures of DTI regions 48 may be found referring to FIGS. 9A, 9B, and 10-12.

Referring to FIG. 13, FSI image sensor chip 100 includes DTI regions 48, which form a grid similar to what is shown in FIG. 9C. Pixel units 54 have portions formed in the regions defined by DTI regions 48. Each of the pixel units 54 may include photo diode 56, reset transistor 58, and additional components (not shown). DTI regions 48 extend from the major surface 20A (which is the front surface) of semiconductor substrate 20 into semiconductor substrate 20. In the FSI image sensor chip 100, there may be no recap oxide layer 45 (FIG. 9A or 9B) formed, and the portions of layers/regions 34, 36, 38, 42, and/or 44 over front surface 20A may also be removed. Interconnect structure 60 is formed over pixel units 54 and DTI regions 48, and includes a plurality of metal lines and vias in a plurality of dielectric layers. Color filters 64 and micro-lenses 66 are formed over interconnect structure 60, and are aligned to pixel units 54. In the FSI image sensor chip 100, light 68 is projected to photo diodes 56 from the front surface of chip 100.

Referring to FIG. 14, the BSI image sensor chip 200 includes DTI regions 48, which form a grid similar to what is shown in FIG. 9C. DTI regions 48 extend from the major surface 20A (which is back surface) of semiconductor substrate 20 into semiconductor substrate 20. Recap oxide layer 45 is schematically illustrated, while the portions of layers 34, 36, 38, 42, and 44 (FIG. 9A or 9B) may exist, although not shown in FIG. 14. In addition to DTI regions 48, BSI image sensor chip 200 may include Shallow Trench Isolation (STI) regions 70 extending from the front surface 20B of semiconductor substrate 20 into substrate 20, wherein some portions of STI regions 70 are aligned to corresponding portions of DTI regions 48. Pixel units 54 have some portions formed in the regions defined by STI regions 70. Each of the pixel units 54 may include photo diode 56, reset transistor 58, and additional components (not shown). Interconnect structure 60 is formed underlying pixel units 54 and STI regions 70, and includes a plurality of metal lines and vias in a plurality of dielectric layers. Metal grid 72 is formed over recap oxide layer 45, and is aligned to corresponding portions of DTI regions 48. Color filters 64 and micro-lenses 66 are formed over metal grid 72, and are aligned to pixel units 54.

Figure 15:
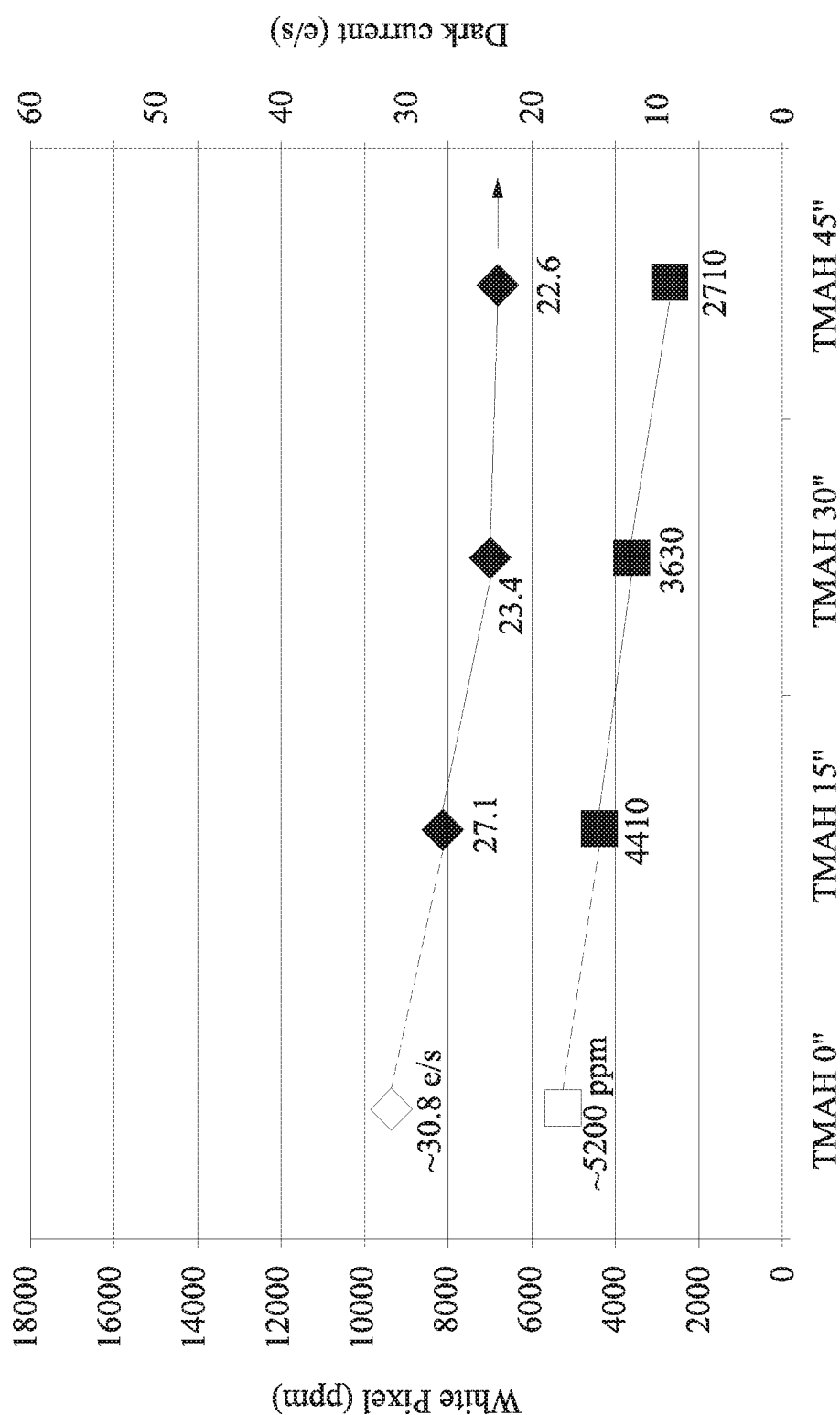
FIG. 15 illustrates experiment results performed on sample silicon wafers, wherein dark currents and the number of white pixels are illustrated as functions of the duration of the damage removal step.

DTI regions 48 have the function of reducing cross-talk, which is caused by light penetration through DTI regions 48 to enter into the photo diodes 56 of neighboring pixels. The quality of DTI regions 48 affects the quality of the image sensor chip. FIG. 15 illustrates experiment results performed on sample silicon wafers, wherein the number of white pixels and dark currents are illustrated as functions of the duration of the damage removal step as shown in FIG. 4. The left-side Y-axis shows the number of white pixels per million pixels (ppm). The right-side Y-axis shows the dark currents. The X-axis shows the duration of the damage removal step performed using TMAH.

It is observed that when no damage removal is performed (the length of the damage removal is 0 seconds (0")), the number of white pixels is about 5,200 ppm, and the dark current is about 30.8 e/s. When a 15-second (15") damage removal is performed, the number of white pixels is reduced to about 4,410 ppm, and the dark current is reduced to about 27.1 e/s. When a 30-second (30") damage removal is performed, the number of white pixels is reduced to about 3,630 ppm, and the dark current is reduced to about 23.4 e/s. When a 45-second (45") damage removal is performed, the number of white pixels is reduced to about 2,710 ppm, and the dark current is reduced to about 22.6 e/s. These experiment results indicate that the damage removal step is effective in the improvement of the image sensors.

The embodiments of the present disclosure have some advantageous features. By performing the damage removal step, the damages in the surface layer of substrate are removed along with the removed surface layer. Accordingly, the quality of the DTI regions is improved. The dark currents and white pixels in image sensor chips are also improved.

In accordance with some embodiments of the present disclosure, a method includes performing an anisotropic etching on a semiconductor substrate to form a trench. The trench has vertical sidewalls and a rounded bottom connected to the vertical sidewalls. A damage removal step is performed to remove a surface layer of the semiconductor substrate, with the surface layer exposed to the trench. The rounded bottom of the trench is etched to form a slant straight bottom surface. The trench is filled to form a trench isolation region in the trench.

In accordance with some embodiments of the present disclosure, a method includes etching a semiconductor substrate to form a trench, and performing a cleaning on the semiconductor substrate and the trench. After the cleaning, a damage removal step is performed to remove a surface layer of the semiconductor substrate, with the surface layer being in the trench. After the damage removal step, the trench is filled to form a trench isolation region in the trench.

In accordance with some embodiments of the present disclosure, an integrated circuit structure includes a semiconductor substrate having a major surface, and a trench isolation region extending from the major surface into the semiconductor substrate. The trench isolation region has a vertical sidewall surface extending from the major surface into the semiconductor substrate, and a slant straight bottom surface connected to the vertical sidewall surface. The vertical sidewall surface is substantially perpendicular to the major surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
   a semiconductor substrate having a major surface; and
   a trench isolation region extending from the major surface into the semiconductor substrate, wherein the trench isolation region comprises:
      a vertical sidewall surface extending from the major surface into the semiconductor substrate, wherein the vertical sidewall surface is substantially perpendicular to the major surface; and
      a slant straight bottom surface connected to the vertical sidewall surface;
   a dielectric layer comprising a first portion comprised in the trench isolation region, and a second portion outside of the trench isolation region, with the second portion having a horizontal top surface; and
   a metal layer comprising a third portion comprised in the trench isolation region, wherein a top surface of the metal layer is higher than an additional top surface of the semiconductor substrate, and wherein the metal layer comprises upper portions narrower than respective lower portions.

2. The integrated circuit structure of claim 1, wherein the vertical sidewall surface and the slant straight bottom surface are both in contact with the semiconductor substrate.

3. The integrated circuit structure of claim 1, wherein the first portion of the dielectric layer comprises substantially vertical opposing portions, with the metal layer being in middle between the substantially vertical opposing portions.

4. The integrated circuit structure of claim 1, wherein the trench isolation region comprises a vertical upper portion and a V-shaped lower portion, and the V-shaped lower portion comprises the slant straight bottom surface and an additional slant straight bottom surface connected to the slant straight bottom surface.

5. The integrated circuit structure of claim 1, wherein the major surface is a back surface of the semiconductor substrate, and the integrated circuit structure further comprises a transistor at a front surface of the semiconductor substrate, with the front surface and the back surface being opposite surfaces of the semiconductor substrate.

6. The integrated circuit structure of claim 1, wherein the metal layer further comprises a fourth portion protruding higher than the major surface of the semiconductor substrate, wherein outmost edges of the metal layer are between opposite sidewalls of the trench isolation region.

7. The integrated circuit structure of claim 1, wherein from a first level to a second level, widths of the metal layer continuously increases, and wherein the first level is a level of the major surface of the semiconductor substrate, and the second level is in middle of the first level and a bottom surface of the trench isolation region.

8. The integrated circuit structure of claim of claim 1, wherein the trench isolation region comprises:
   a first plurality of elongated parts having lengthwise direction in a first direction; and
   a second plurality of elongated parts having lengthwise direction in a second direction perpendicular to the first direction, wherein the first plurality of elongated parts are physically joined to the second plurality of elongated parts.

9. A structure comprising:
   a semiconductor substrate comprising a top surface;
   a filling metallic material;
   an isolation structure extending into the semiconductor substrate, the isolation structure comprising:
      a first dielectric layer, wherein the first dielectric layer comprises substantially vertical upper portions, and an U-shaped lower portion underlying and connected to the substantially vertical upper portions, wherein both the substantially vertical upper portions and the U-shaped lower portion extend into the semiconductor substrate;
      a second dielectric layer over the first dielectric layer; and
      a lower portion of the filling metallic material over the second dielectric layer, wherein a portion of the filling metallic material is in middle of the substantially vertical upper portions of the first dielectric layer, and the lower portion extends to a level higher than the top surface of the semiconductor substrate; and
   a recap oxide layer comprising a first portion directly above the isolation structure.

10. The structure of claim 9, wherein at an intermediate level between a first level of the top surface of the semiconductor substrate and a second level of a bottom surface of the isolation structure, the filling metallic material has a greatest width, and from the intermediate level to the first level, widths of the filling metallic material gradually reduce.

11. The structure of claim 10, wherein from the intermediate level to the second level, widths of the filling metallic material gradually reduce.

12. The structure of claim 10, wherein the filling metallic material comprises a first side edge and a second side edge opposing to each other, and wherein substantially an entirety of the recap oxide layer is higher than topmost ends of the first side edge and the second side edge.

13. The structure of claim 9, wherein the first dielectric layer and the filling metallic material both comprise portions extending out of the semiconductor substrate, and wherein the recap oxide layer further comprises a second portion extending laterally beyond edges of the isolation structure.

14. The structure of claim 13 further comprising a micro lens overlapping the recap oxide layer.

15. A structure comprising:
   a semiconductor substrate;
   an isolation structure extending into the semiconductor substrate, the isolation structure comprising:
      a liner dielectric layer;
      a first high-k dielectric layer over the liner dielectric layer; and
      a second high-k dielectric layer over the first high-k dielectric layer, wherein the first high-k dielectric layer and the second high-k dielectric layer are formed of different high-k dielectric materials; and a metal core comprising a first part in the isolation structure, wherein the first part is over a bottom portion of the second high-k dielectric layer and between opposing vertical portions of the second high-k dielectric layer, and wherein the first part of the metal core has upper widths smaller than respective lower widths of the metal core.

16. The structure of claim 15, wherein the first high-k dielectric layer comprises hafnium oxide, and the second high-k dielectric layer comprises tantalum oxide.

17. The structure of claim 15 further comprising a buffer oxide layer, wherein the second high-k dielectric layer contacts an upper portion of the first high-k dielectric layer, and the buffer oxide layer contacts a lower portion of the first high-k dielectric layer.

18. The structure of claim 15, wherein both the first high-k dielectric layer and the second high-k dielectric layer comprise horizontal portions overlapping the semiconductor substrate.

19. The structure of claim 18 further comprising a recap oxide layer comprising:
   a first portion extending between portions of the second high-k dielectric layer, with sidewalls of the first portion of the recap oxide layer contacting sidewalls of the portions of the second high-k dielectric layer; and
   a second portion overlapping the horizontal portions of the first high-k dielectric layer and the second high-k dielectric layer.

20. The structure of claim 15, wherein the metal core further comprises a second part protruding out of the semiconductor substrate, wherein the second part is narrow than the first part.

\* \* \* \* \*